United States Patent [19]
McKenna et al.
[11] Patent Number: 4,686,414
[45] Date of Patent: Aug. 11, 1987

[54] ENHANCED WETTING OF LIQUID METAL ALLOY ION SOURCES

[75] Inventors: Charles M. McKenna, Boxford, Mass.; Irwin R. Sharapata, Canoga Park; William M. Clark, Jr., Thousand Oaks, both of Calif.

[73] Assignee: Hughes Aircraft Company, Los Angeles, Calif.

[21] Appl. No.: 673,465

[22] Filed: Nov. 20, 1984

[51] Int. Cl.⁴ ........................ H01J 27/02; H01J 37/08

[52] U.S. Cl. ................................ 313/362.1; 204/37.1; 204/38.5; 204/40; 250/423 R; 313/336; 427/376.8; 427/405; 427/431

[58] Field of Search ....................... 204/37.1, 40, 38.1, 204/38.5; 313/362.1, 363.1, 163, 232, 550, 566, 336; 315/111.81; 250/423 R; 427/58, 374.4, 376.8, 405, 431

[56] References Cited

U.S. PATENT DOCUMENTS

| | | | |
|---|---|---|---|
| 2,640,020 | 5/1953 | Pollard | 204/34 |
| 4,318,030 | 3/1982 | Jergenson | 315/111.81 |
| 4,367,429 | 1/1983 | Wang et al. | 313/362.1 |

*Primary Examiner*—John F. Niebling
*Assistant Examiner*—William T. Leader
*Attorney, Agent, or Firm*—Wanda K. Denson-Low; A. W. Karambelas

[57] ABSTRACT

A process for enhancing the wettability of evaporation elements, such as substrates and metal reservoirs used in liquid metal ion sources, and the elements so produced wherein a coating material is wettably coated onto the evaporation element at a coating temperature greater than the ion source operating temperature. The coated element is cooled to the operating temperature, and then contacted with the molten ion source alloy. The coating material is selected to wet the substrate or reservoir at the coating temperature, but to be itself wet by the ion source alloy at the ion source operating temperature. The preferred coating metal is gold, which is first applied by electrodeposition onto the evaporation element, and the evaporation element and coating are heated to a coating temperature of about 800° C. to complete the coating step. The coated evaporation element is cooled to the source operating temperature of 200° C.-300° C. and dipped into the ion source alloy, which may be an alloy such as lead-gold-arsenic or lead-gold-antimony.

23 Claims, 4 Drawing Figures

10
28
32
30
34
43
38
36
38
40
Y
X
42
$V_H$
$V_E$
$V_L$

ENHANCED WETTING OF LIQUID METAL ALLOY ION SOURCES

The U.S. Government has rights in this invention pursuant to contract No. 81-F-597-000.

BACKGROUND OF THE INVENTION

This invention relates to liquid metal ion sources, and, more particularly, to enhancement of the wetting of an evaporation element of the ion source by an ion source alloy.

Liquid metal ion sources provide high current densities of metallic ions from a source having a small virtual source size. Such high brightness and small source size are required when the ion beam is to be focused with a high resolution of, for example, less than one micrometer spot size, and utilized in applications such as fabrication of semiconductor microcircuits. The high current density and small virtual source size are achieved by emitting the ions from a substrate having a sharp point, such as the point of a needle. In one such approach, a needle is covered with a layer of liquid ion source metal, and a cusp in the liquid metal at the point of the needle is created by application of an electrostatic field. This fine cusp then becomes the emitting source for evaporation of the ions. As the ions are emitted from the source, more liquid metal must flow from a reservoir down the needle to the cusp to replenish that evaporated.

For this type of high brightness ion source to operate properly, the ion source metal must wet the needle to ensure a smooth flow of metal from the reservoir to the cusp. If the ion source metal does not wet the needle, or wets the needle incompletely, the source metal alloy may form balls or lumps along the surface of the needle, thereby interfering with the metal flow, preventing the formation of the cusp, and increasing the apparent source size, with the result that the emitted ion beam cannot be properly focused.

In some instances, ion source alloys naturally wet the needle, which is typically made of common materials such as steel, nickel, tungsten, rhenium, metal carbides, etc. In other cases, however, there is no suitable needle that is wet by a desirable ion source alloy. As an example, lead-gold-antimony alloys and lead-gold-arsenic alloys used as ion sources for antimony and arsenic do not readily wet these needle substrate materials at the preferred operating temperature of about 200° C.–300° C. There exists a need for an approach for enhancing the wetting of ion evaporation elements such as ion source substrate needles.

One proposed approach to enhancing wettability is simply to increase the ion source substrate operating temperature at which the ions are evaporated, so that the surface energy of the ion source alloy is reduced and wetting is more easily achieved. However, this solution is not workable, since increasing the temperature also increases the evaporation rate of volatile ionic species such as antimony and arsenic. In the alloys discussed above as examples, increasing the temperature above the preferred operating temperature preferentially evaporates the metalloid species, so that the composition of the ion beam varies with time. This variation is not acceptable in operations such as ion implantation in semiconductors, since performance of the semiconductor circuit depends upon the exact composition of the implanted ionic species. It has also been found that various mechanical techiques such as melting the ion source alloy at the junction between the reservoir and the needle substrate, or directly dipping a needle into the molten alloy, do not lead to substantial wetting.

Consequently, there continues to exist a need for a technique for enhancing the wettability of ion source alloys on evaporation elements such as needles and reservoirs. Any such technique should not result in a substantially increased melting point of the ion source alloy, which could result in preferential evaporation of the volatile components. Further, the approach should not result in a significant variation of the evaporation rate and composition of the ion beam with time. The present invention fulfills this need, and further provides related advantages.

SUMMARY OF THE INVENTION

The present invention provides an improved evaporation element of enhanced wettability, for use in liquid metal ion sources, and a process for preparing such an element wherein a coating is applied to the evaporation element prior to contacting the evaporation element with an ion source alloy. Application of the coating does not require modification of the design of the evaporation element. The coating improves the wettability of the evaporation element by the ion source alloy, thereby ensuring a smooth flow of the ion source alloy along the evaporation element. When using this approach, the ion source alloy need not be heated to a temperature significantly greater than the optimal operating temperature in order to achieve wetting, thus decreasing the likelihood that volatile constituents of the source alloy will be preferentially evaporated.

In accordance with the present invention, a process for preparing an evaporation element having enhanced wettability for use in liquid metal ion sources includes the selection of a coating material and coating the evaporation element with the coating material at a temperature greater than the ion source operating temperature, and then contacting the ion source alloy to the coated evaporation element at about the evaporation operating temperature. The coating material is selected to wet the evaporation element at a temperature above that at which a liquid layer is formed between the coating and the evaporation element, to be wet by the source alloy at the operating temperature, and to not increase substantially the melting point of the source alloy when dissolved therein.

In particularly preferred embodiments, the coating material is gold and the ion source alloy is a lead-gold-antimony or lead-gold-arsenic alloy. Further, in the preferred embodiments, a thin layer of nickel is deposited onto the evaporation element, which is preferably a needle evaporation substrate, prior to coating with gold, to improve the bonding between the coating and evaporation element. In this preferred embodiment, a layer of nickel about 0.3 micrometers thick is electrodeposited onto the evaporation element, and then a layer of gold about 0.3 micrometers thick is electrodeposited over the nickel layer, both electrodepositions occurring at ambient temperature. The element with the nickel and gold layers thereon is heated to a coating temperature sufficiently high so that a liquid layer is formed adjacent the surface of the evaporation element between the evaporation element and the coating, to improve the bonding of the coating onto the element. This coating temperature is typically from 600° C. to about 1000° C., preferably about 800° C., and the heating is preferably accomplished in a vacuum.

The coated element is next cooled to the preferred operating temperature of from about 200° C. to about 300° C., and the ion source alloy is applied to the coated element, preferably by dipping the coated element into a pool of the ion source alloy or placing a piece of the alloy in contact with the element. Once this contact is accomplished, the ion source element may be utilized in a conventional fashion, and the described process for enhancing the wettability ensures a smooth flow of the liquid ion source alloy along the element during operation. The process therefore "primes" the evaporation element in the sense that it establishes a first wetted layer of the ion source alloy on the evaporation element, so that source alloy later flowing over the element can maintain the wetted layer.

Although the coating operation is described above in terms of placing a layer of gold onto the needle, other approaches to coating the evaporation elements are contemplated by the invention. For example, the coating material may be placed onto the surface of the evaporation element by other techniques, or at the coating temperature.

As will now be appreciated, the process for enhancing the wettability of a liquid metal ion source evaporation element allows the evaporation element to be prepared before contacting to the ion source alloy so that the ion source alloy will readily wet the element, thereby ensuring that the ion source may be easily put into operation when desired. Further, the ion source alloy need not be heated above the evaporation temperature during the initial wetting step, thereby risking the loss of volatile constituents from the alloy. By contrast, prior approaches to achieving wetting of the evaporation element by the ion source alloy required that the source alloy be heated significantly higher than its operating temperature, and even then did not ensure that wetting would be achieved. Other features and advantages of the present invention will become apparent from the following more detailed description, taken in conjunction with the accompanying drawings, which illustrate, by way of example, the principles of the present invention.

DETAILED DESCRIPTION OF THE PREFERRED EMBODIMENT

Figure 1:
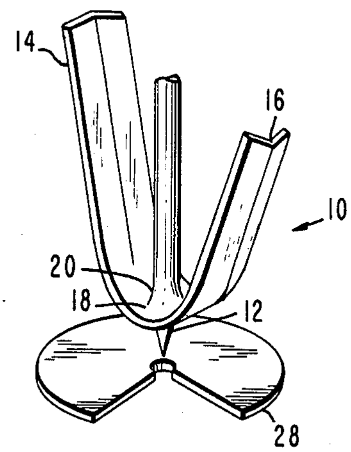
FIG. 1 is a perspective view of a liquid metal ion source.

The present invention relates to a liquid metal ion source, a preferred embodiment of which is indicated by the numeral 10 in FIG. 1. The ion source 10 includes an evaporation substrate needle 12 typically having a tip radius of less than about 20 micrometers and an apex half angle of less than about 49.5° C., which extends through a hole (not shown) at the lower end of a generally U-shaped heater element 14. The heater element 14 is in the form of a ribbon having a depressed center to form a channel 16 therein. A reservoir 18 of a liquid ion source alloy containing the ions to be emitted is contained within the channel 16 of the heater element 14 at the lowest point of the U-shaped heater element 14, where the needle 12 penetrates through the hole (not shown). As electrical current produced by a voltage $V_H$ is passed through the heater element 14 to melt the ion source alloy in the reservoir 18, which then forms a liquid fillet 20 between the needle 12 and the heater element 14.

Figure 2:
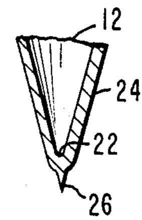
FIG. 2 is an enlarged cross-sectional view of a detail of FIG. 1, taken generally on line 2—2.

Referring to FIG. 2, the liquid ion source metal from the reservoir 18 flows toward a point 22 of the needle 12, forming a liquid layer 24 along the tip of the needle 12. At the very point 22 of the needle 12, where the liquid layers 24 from the sides of the needle 12 meet, the action of an applied external electrostatic field from an extraction electrode 28 draws the liquid layer 24 downwardly to form a cusp 26, which serves as the emitter point for the ion source 10. That is, the ions emitted by the ion source 10 are preferably emitted only from the cusp 26, so that ions appear to emanate from a point source of extremely small dimensions. Positively charged metallic ions are drawn from the cusp 26 by the extraction electrode 28 and exit the ion source 10 through a hole in the extraction electrode 28. With this configuration, the current density of emitted ions at the cusp 26 can be very large, typically on the order of $10^6$ amps per square centimeter per steradian.

As described in the preceding paragraph, the liquid layer 24 desirably flows from the reservoir 18 down the surface of the needle 12 to the cusp 26, for emission. However, it is often difficult to initiate a flow of metal to form the reservoir 18, and it is also sometimes difficult to initiate a wetted flow of metal along the needle 12 in the layer 24.

Figure 4:
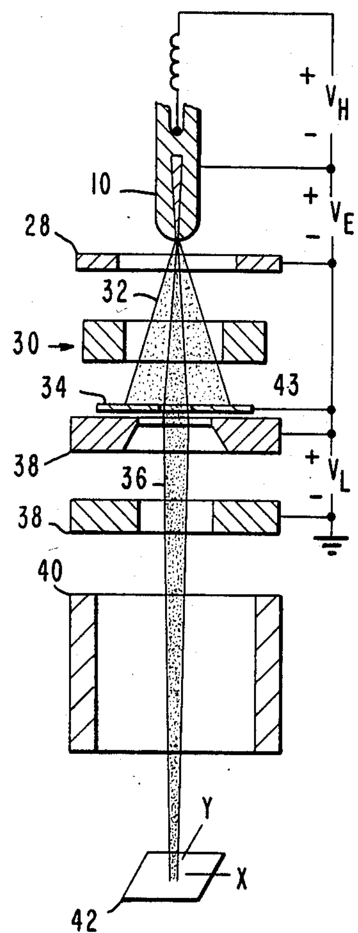
FIG. 4 is a schematic sectional side view of a scanning ion probe employing a liquid metal ion source.

FIG. 4 illustrates one important application of the use of liquid metal ion sources of the type illustrated in FIG. 1 and 2. The ion source 10 is mounted in a scanning ion probe 30. The extraction electrode 28, which is negatively biased with respect to the needle 12 by a voltage $V_E$, draws ions out of the cusp 26, to form an ion beam 32. The cross-sectional shape of the beam of ions 32 is defined by an aperture 34. The transmitted beam 36 emerging from the aperture 34 is passed through accelerating electrodes 38 which increase the energy of the beam 36, as the second accelerating electrode is negatively biased with respect to the first by a voltage $V_L$. The beam 36 then passes through electrostatic deflection electrodes 40, wherein the beam is deflected from side to side to move in a scanning fashion across the surface of a target 42. The transmitted beam 36 can then be used to write various patterns upon the surface of the target 42 in the form of ion-implanted zones of controllable shape and type.

Optionally, there is provided a mass separator 43 to deflect ions of differing masses by differing amounts. The mass separator 43 is preferably positioned between the extraction electrode 28 and the aperature 34, and includes means to produce a magnetic and an electrical field within the mass separator 43. The fields within the mass separator 43 deflect the moving ions by amounts which are related to the mass, velocity, and charge of the ion in the beam. By varying the strength of the magnetic and electrical fields and the positioning of the mass separator 43, it is possible to allow only a single desirable species to pass through the aperture 34 to be implanted in the target 42.

In accordance with a preferred embodiment of the invention, the wetting reaction between a liquid metal ion source evaporation element, such as the needle 12 or the heater element 14, on the one hand, and the liquid ion source alloy on the other, is enhanced by depositing a layer of gold onto the evaporation element, heating the element to form a metallic melt at the surface of the evaporation element to coat the element with the deposited gold, cooling the evaporation element to the ion source operating temperature, and then applying the ion source alloy to the coated evaporation element, as by dipping the evaporation element into a liquid bath of the source alloy. The presence of the gold coating allows the ion source alloy to wet the surface of the evaporation element immediately without heating the ion source alloy to a temperature significantly above the intended ion source operating temperature. Once the initial wetting has been accomplished, wetting of the evaporation element by the source alloy in the liquid layer 24 continues as the alloy flows from the reservoir 18 to the cusp 26.

Gold is chosen as the preferred coating material because it can be made to wet the evaporation element when heated to a sufficiently high coating temperature. Second, the gold is itself wet by the liquid ion source alloy at the evaporation or operating temperature of the liquid metal ion source 10. Finally, the gold dissolved into the ion source alloy at the evaporation operating temperature during extended source operation does not substantially increase the melting point of the source alloy. The effect of the gold dissolved into the source alloy may be controlled by restricting the thickness of the gold layer and by adjusting the composition of the source alloy to be near a eutectic but slightly deficient in gold (if gold is a constituent of the alloy), so that dissolution of gold into the alloy moves the alloy toward the lower-melting temperature eutectic composition.

Figure 3:
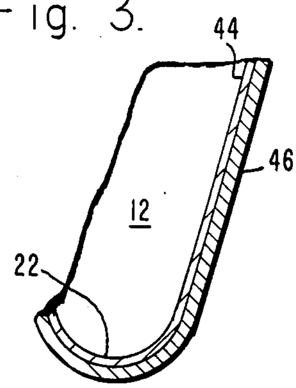
FIG. 3 is an enlarged cross-sectional view of a needle illustrating a nickel layer and a gold layer thereon.

In a preferred approach illustrated in FIG. 3, a nickel layer 44 about 0.3 micrometers thick is first electroplated onto the evaporation element, shown in FIG. 3 as the needle 12, for which improved wettability is sought. A gold layer 46 approximately 0.3 micrometers thick is then electroplated on top of the nickel layer, so that the nickel layer provides a well-bonded substrate base to which the gold can adhere. Typically, the needle 12 is so covered with a gold layer, but the heater element 14 may also be so treated for improved wettability. The thickness of the layers of nickel and gold are not critical, but should not be so thin as to be dissolved rapidly nor so thick as to obscure the surface features of the evaporation element. The coatings are preferably about 0.1 to 1.0 micrometers thick, and most preferably 0.3 micrometers thick. As used herein, reference to coating an element means that a coating material may be applied directly to the surface of the element, or, alternatively, an intermediate layer (such as nickel) may be provided between the coating (such as gold) and the substrate.

The ion source 10 is then assembled by mounting the needle 12 and the heater element 14 together and placing them in a vacuum chamber. An electric current is passed through the heater element 14 to heat the element 14 and the needle 12 until a liquid forms, thereby coating the substrate needle 12.

Coverage of the substrate needle 12 by the gold can occur by one of at least two mechanisms. If the surface free energy of the gold against vacuum plus the surface free energy of the substrate needle aganist gold is less than the surface free energy of the substrate needle against a vacuum, at the heating temperature chosen, then the gold layer can spread across the surface of the substrate without the need for any gross chemical reaction between the substrate and the gold layer. Alternatively, the material of the substrate needle and the gold may form an alloy by reacting together, thereby reducing the surface free energy and causing the gold to spread across the surface. The latter type of reactive wetting is believed to occur for gold on steel and nickel substrates, while non-reactive wetting is seen for molybdenum and tungsten substrates.

At this point in the processing of the evaporation element to improve the wettability, the ion source alloy has not yet been contacted to the element. It is therefore acceptable to heat the evaporation element being coated with gold to a high coating temperature, which would not be possible in the presence of the ion source alloy due to the evaporation of volatile constituents therefrom. In the case of gold, the gold coats the surface of the evaporation element upon heating to a coating temperature of from about 600° C. to about 1000° C., and preferably a temperature of about 800° C. is used.

After the surface of the evaporation element has been coated with gold in vacuum, its temperature is reduced to the intended evaporation operating temperature, which is typically from about 200° C. to about 300° C. The coated element is then contacted with the source alloy or one of the higher melting constituents thereof by any suitable technique, whereupon the surface of the needle or the heater element is wet by the alloy. For example, contacting may be achieved by simply dipping the needle 12 or the heater element 14 together into a pool of the ion source alloy. Alternatively, only the point of the needle 12 may be immersed into the pool, and then a pellet of the ion source alloy may be placed into the reservoir 18. In yet another approach, a pellet of the source alloy is loaded into the reservoir 18 and then melted, thereby wetting both the reservoir 18 and the needle 12. The ion source 10 is then ready for operation, and may be placed into the apparatus such as the scanning ion probe 30 depicted in FIG. 3.

The following Example is to be taken as illustrative of the present invention, and should not be taken as limiting the invention in any respect.

EXAMPLE

A cold rolled steel needle having a diameter of about 0.015 inches was electroplated with a layer of nickel about 0.3 micrometers thick and then a layer of gold about 0.3 micrometers thick. The electroplated needle was mounted in a fitting together will a low-carbon, cold rolled steel heater element as depicted in FIG. 1. The assembly was placed into a vacuum chamber, and an electric current was passed through the heater element, to produce a temperature of the needle estimated to be about 800° C. The current was reduced so that the needle temperature fell to the operating temperature of about 300° C., and the needle was dipped into a molten pool of $Pb_{.82}Au_{.15}As_{.03}$ to wet the needle. The power to the heater ribbon was removed, and the needle was cooled to room temperature. Air was introduced into the vacuum chamber, and a pellet of $Pb_{.82}Au_{.15}As_{.03}$ ion source alloy was placed on top of the heater element 14 in the reservoir 18, at the junction of the heater element 14 and the needle 12. (Alloy compositions herein are indicated by the standard shorthand notation used above, wherein the subscript indicates a weight fraction.)

The needle and heater were reinstalled in the fixture and reheated under vacuum to just above the melting point of the source alloy, about 300° C. for this alloy, to melt the lead-gold-arsenic alloy, which wet the gold-coated needle. The ion source was then operated for about one hour at about 300° C., and there were no signs of accelerated or preferential evaporation of the arsenic, which is ordinarily the most volatile element in the ion source alloy.

The Example was repeated for the following alloys, with substantially the same results: $Pb_{.82}$ $Au_{.15}$ $As_{.03}$, $Pb_{.30}$ $Au_{.45}$ As 25, $Pb_{.21}$ $Au_{.51}$ $Sb_{.28}$, $Pb_{.36}$ $Bi_{.47}$ $Sn_{.12}$ $As_{.05}$, $Au_{.83}$ $Sn_{.11}$ $As_{.06}$, $Au_{.82}$ $Sn_{.13}$ $As_{.05}$, $Au_{.74}$ $Sn_{.18}$ $As_{.08}$. The only difference between alloys is that the source operating temperature varies in the range of about 200° C. to about 300° C., depending upon the melting point of the alloy. This Example also demonstrates that the source alloy need not contain the coating material as a constituent thereof, as $Pb_{.36}Bi_{.47}$ $Sn_{.12}$ $As_{.05}$ does not contain gold.

As can now be appreciated, the present invention provides a method for enhancing the wettability of an evaporation element such as a needle or a heater ribbon used in a liquid metal ion source. The evaporation element can be treated so that the initial wetting of the element is easily accomplished without trial and error. Moreover, in achieving the wetting and flow of the source alloy, it is not necessary to heat the source alloy above its intended evaporation temperature, and volatile constituents are not lost.

Although a particular embodiment of the invention has been described in detail for purposes of illustration, various modifications may be made without departing from the true nature and scope of the invention. Accordingly, the invention is not to be limited except as by the appended claims.

What is claimed is:

1. A process for preparing an evaporation element of enhanced wettability used in liquid metal ion sources to evaporate an ion source alloy at an operating temperature, comprising the steps of:

selecting a coating material, the coating material being selected to wet the evaporation element at a temperature greater than the operating temperature of the liquid metal ion source alloy, to be wet by the source alloy at the operating temperature, and to not increase substantially the melting point of the source alloy when dissolved therein;

coating the evaporation element with the coating material at a coating temperature sufficiently high so that a liquid layer is formed adjacent the surface of the evaporation element; and contacting the ion source alloy to the coated evaporation element at about the operating temperature to establish a first wetted layer of the ion source alloy on the evaporation element.

2. The process of claim 1, wherein said step of coating comprises the steps of:

depositing a layer of the coating material onto the evaporation element at ambient temperature; and heating the evaporation element and coating layer to a coating temperature whereat the coating wets the evaporation element by forming a liquid layer thereagainst.

3. The process of claim 1, wherein said step of coating is preceded by the step of:

treating the evaporation element to improve adherance between the coating material and the element.

4. The process of claim 3, wherein said step of treating is accomplished by placing a second coating on the evaporation element.

5. The process of claim 1, wherein said step of contacting is accomplished by dipping the evaporation element into a pool of the ion source material.

6. The process of claim 2, wherein the evaporation element is an evaporation substrate needle.

7. The process of claim 1, wherein the coating material is gold, and the ion source alloy is an alloy selected from the group consisting of a lead-gold-antimony alloy and a lead-gold-arsenic alloy.

8. The process of claim 1, wherein the evaporation element is made of a material selected from the group consisting of steel, nickel, molybdenum, tungsten, and rhenium, and a metal carbide.

9. An evaporation element of enhanced wettability, prepared by the process of claim 1.

10. A process for enhancing the wettability of a liquid metal ion source evaporation element by an ion source alloy, comprising the steps of:

depositing a layer of gold onto the evaporation element;

heating the evaporation element with the gold layer thereon to a coating temperature greater than about 600° C.; and contacting the ion source alloy to the coated evaporation element at a temperature of from about 200° C. to about 300° C. to establish a first wetted layer of the ion source alloy on the evaporation element.

11. The process of claim 10, wherein the ion source alloy is an alloy selected from the group consisting of lead-gold-antimony and lead-gold-arsenic.

12. The process of claim 10, including the further step of:

depositing a layer of nickel onto the evaporation element, prior to said step of depositing the layer of gold, so that the layer of gold is deposited over the layer of nickel.

13. The process of claim 10, wherein the evaporation element is a needle.

14. The process of claim 10, wherein the temperature in said step of heating is from about 600° C. to about 1000° C.

15. The process of claim 10, wherein the thickness of the gold deposit is from about 0.1 to about 1.0 micrometers.

16. The process of claim 10, wherein said step of contacting includes the step of dipping the coated element into a pool of the source alloy.

17. The process of claim 10, wherein said step of contacting includes the step of placing a pellet of the ion source alloy in contact with the coated evaporation element.

18. The process of claim 10, wherein said step of depositing a layer of gold is accomplished by electroplating.

19. A liquid metal ion source element comprising:

(a) an ion source substrate;

(b) a layer of a coating material adjacent and substantially covering the surface of said source substrate, said coating material being characterized as readily wetting the surface of said source substrate at a first given temperature; and (c) a layer of an ion source alloy adjacent and substantially covering the surface of said coating material layer, said coating material being further characterized as being readily wetted by said ion source alloy at a second given temperature that is less than said first given temperature, said second given temperature being approximately the operating temperature of said ion source element.

20. The ion source of claim 19 wherein said coating material is further characterized as not significantly increasing the melting point of said ion source alloy due to a portion of said coating material layer disolving into said ion source alloy layer.

21. The ion source of claim 20 wherein said ion source substrate includes a layer of a bond-enhancing material as the surface portion of said ion source substrate, said bond-enhancing material being characterized as reactively bonding with said coating material at said first given temperature.

22. The ion source of claim 21 wherein said coating material is substantially comprised of gold.

23. The ion source of claim 22 wherein said bond-enhancing material is substantially comprised of nickel.

* * * * *